United States Patent
Iwagami et al.

(10) Patent No.: US 7,102,376 B2
(45) Date of Patent: Sep. 5, 2006

(54) POWER SEMICONDUCTOR MODULE WITH DETECTOR FOR DETECTING MAIN CIRCUIT CURRENT THROUGH POWER SEMICONDUCTOR ELEMENT

(75) Inventors: Toru Iwagami, Tokyo (JP); Shinya Shirakawa, Tokyo (JP); Mamoru Seo, Tokyo (JP); Masaki Sakai, Fukuoka (JP); Dong Wang, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/846,546

(22) Filed: May 17, 2004

(65) Prior Publication Data

US 2005/0007139 A1 Jan. 13, 2005

(30) Foreign Application Priority Data

Jul. 11, 2003 (JP) ............................. 2003-273300

(51) Int. Cl.
*G01R 31/26* (2006.01)
(52) U.S. Cl. .................................. 324/765
(58) Field of Classification Search .................. None
See application file for complete search history.

(56) References Cited

U.S. PATENT DOCUMENTS

| 4,204,187 | A | * | 5/1980 | Kakuhashi et al. | ......... | 338/307 |
|---|---|---|---|---|---|---|
| 5,459,356 | A | * | 10/1995 | Schulze et al. | ............ | 257/773 |
| 5,469,131 | A | * | 11/1995 | Takahashi et al. | ......... | 338/306 |
| 6,559,631 | B1 | * | 5/2003 | Balch et al. | ............... | 324/142 |
| 6,703,703 | B1 | * | 3/2004 | Grant | ........................ | 257/688 |
| 2002/0190325 | A1 | | 12/2002 | Mochizuki | | |
| 2003/0042601 | A1 | * | 3/2003 | Ariie et al. | ................. | 257/723 |
| 2003/0141587 | A1 | * | 7/2003 | Frey | ........................... | 257/723 |

FOREIGN PATENT DOCUMENTS

| JP | 53-113180 | * | 9/1978 |
|---|---|---|---|
| JP | 6-112614 | | 4/1994 |

OTHER PUBLICATIONS

J.A. Ferreira et al. Integration of High Frequency Current Shunts in Power Electronic Circuits□□Jan. 1995. IEEE Transactions on Power Electronics vol. 10 No. 1. p. 33.*

* cited by examiner

*Primary Examiner*—Minh Nhut Tang
*Assistant Examiner*—Richard Isla-Rodas
(74) *Attorney, Agent, or Firm*—Oblon, Spivak, McClelland, Maier & Neustadt, P.C.

(57) ABSTRACT

A power semiconductor module has a detector for detecting main circuit current passing through a power semiconductor element. The detector includes first and second circuit patterns; a bonding wire connected at first and second bonding points with the first and second circuit patterns, respectively; and a pair of terminal patterns extended from near the first and second bonding points of the first and second circuit patterns. The detector is designed to detect a potential difference between the pair of terminal patterns generated by flowing main circuit current through the first circuit pattern, the bonding wire and then the second circuit pattern, in order to detect a potential difference across the bonding wire.

3 Claims, 7 Drawing Sheets ued States Patent

POWER SEMICONDUCTOR MODULE WITH DETECTOR FOR DETECTING MAIN CIRCUIT CURRENT THROUGH POWER SEMICONDUCTOR ELEMENT

RELATED APPLICATION

This application is based on Japanese Patent Application No. 2003-273300, the content of which being incorporated herein by reference.

BACKGROUND OF THE INVENTION

1. Field of the Invention

The present invention relates to a power semiconductor module, and in particular to a power semiconductor module having a detector for detecting main circuit current passing through a power semiconductor element. The present invention also relates to a system for determining the main circuit current.

2. Description of the Related Art

Conventionally, there has been known a power semiconductor module in which main circuit current passing through a power semiconductor element is detected in order to prevent a breakdown of the element due to overcurrent or to feedback control an external load, as disclosed in, for example, Japanese Patent Publication No. 6-112614.

In general, in order to detect main circuit current through a power semiconductor element, a current detection resistance or shunt resistance is provided in a passage of the main circuit current. By measuring a voltage drop V generated across the shunt resistance, the main circuit current I is calculated as V/R. R is an ohmic value of the shunt resistance.

However, cost and power loss associated with the shunt resistance are high. Also, regardless of where the shunt resistance is located, i.e. within or outside the module, the size of a wiring area becomes greater because of the shunt resistance. Further, since the circuit becomes complicated, the cost of the module is increased.

In addition, where a fast switching element such as IGBT (Insulated Gate Bipolar Transistor) is used as power semiconductor element, inductance of the wiring of the module need to be reduced in order to, for example, protect the element.

SUMMARY OF THE INVENTION

An object of the present invention is to provide a power semiconductor module in which main circuit current is detected without a shunt resistance.

Another object of the present invention is to provide such power semiconductor module in which inductance of the wiring of the module can be reduced.

Yet another object of the present invention is to provide a system used for a power semiconductor module, which can reliably determine main circuit current.

To achieve the above objects, a first aspect of the present invention is a power semiconductor module that includes a detector for detecting main circuit current passing through a power semiconductor element. The detector includes first and second circuit patterns; a bonding wire connected at first and second bonding points with the first and second circuit patterns., respectively; and a pair of terminal patterns extended from near the first and second bonding points of the first and second circuit patterns. The detector is designed to detect a potential difference between the pair of terminal patterns generated by flowing main circuit current through the first circuit pattern, the bonding wire and then the second circuit pattern, in order to detect a potential difference across the bonding wire.

In accordance with the first aspect of the invention, main circuit current is detected by means of a bonding wire instead of a shunt resistance. As a result, power loss in the detector is lower, the size of a wiring area can be smaller and the circuit can be simplified, allowing the cost of the module to be reduced.

Preferably, either one of the first and second circuit patterns has a region adjacent to and generally parallel to the bonding wire so that the region and the bonding wire carry current in generally opposite directions. This reduces inductance of the boding wire and therefore wiring inductance of the module.

A second aspect of the present invention is a system that determines main circuit current passing through a power semiconductor element of a power semiconductor module. The system is incorporated with a detector. The detector includes first and second circuit patterns; a bonding wire connected at first and second bonding points with the first and second circuit patterns, respectively; and a pair of terminal patterns extended from near the first and second bonding points of the first and second circuit patterns. The detector is designed to detect a potential difference between the pair of terminal patterns generated by flowing main circuit current through the first circuit pattern, the bonding wire and then the second circuit pattern, in order to detect a potential difference across the bonding wire. The system also includes a temperature sensor for detecting a temperature of the bonding wire and a temperature compensating circuit having a table indicative of a relationship between the temperature and ohmic value of the bonding wire. The temperature compensating circuit determines an ohmic value of the bonding wire based on the temperature information from the temperature sensor to determine the main circuit current based on the ohmic value and the potential difference detected by the detector.

In accordance with the second aspect of the invention, since the system utilizes a temperature characteristic of the bonding wire through which main circuit current is flown, the value of the main circuit current can be determined with high accuracy.

BRIEF DESCRIPTION OF THE DRAWINGS

The above-mentioned and other objects, advantages and features of the invention will become apparent from the following description thereof taken in conjunction with the accompanying drawings in which.

DETAILED DESCRIPTION OF THE PREFERRED EMBODIMENTS

With reference to the drawings, preferred embodiments of the present invention will be described hereinafter. In the description, the power semiconductor module is applied to an inverter device, which is not restrictive of the present invention.

First Embodiment

Figure 1:
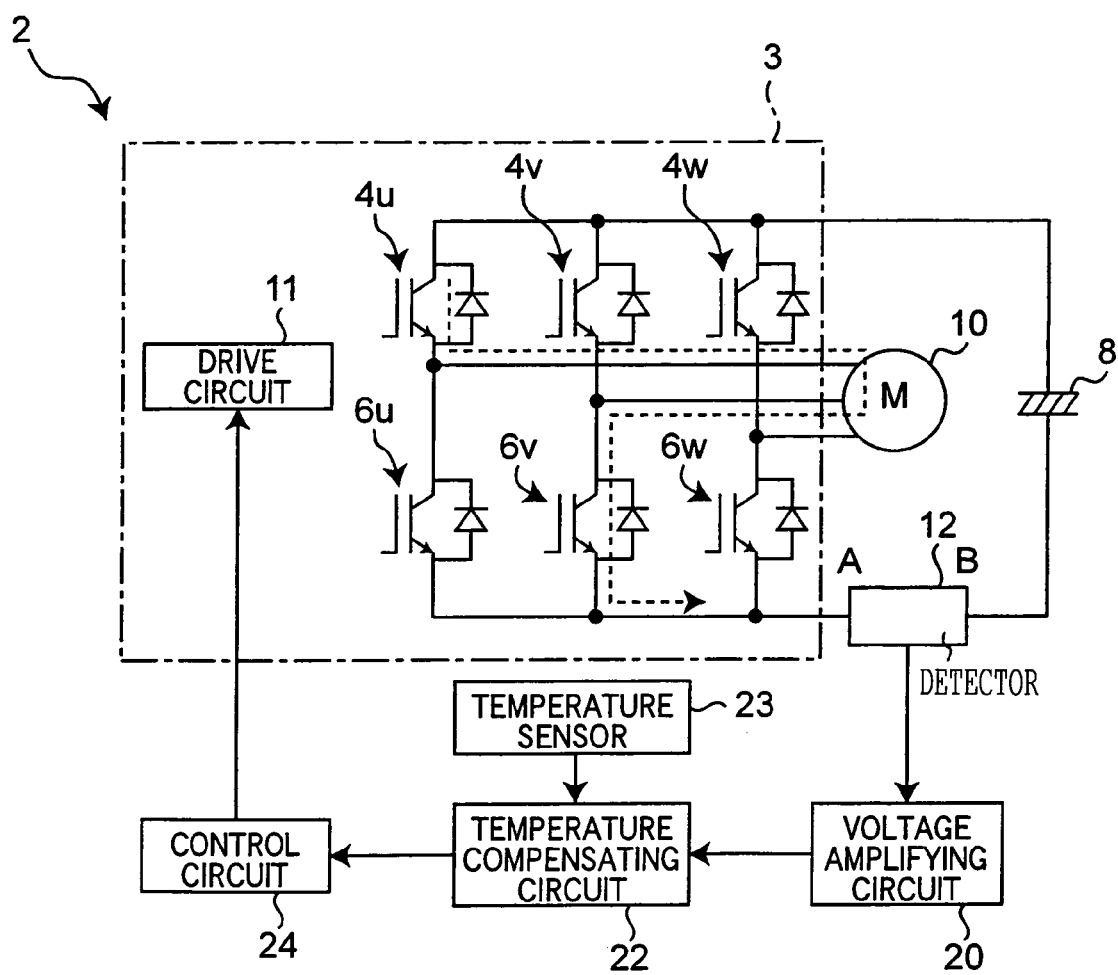
FIG. 1 is a circuit diagram of a first embodiment of the power semiconductor module according to the present invention.

Referring to FIG. 1, there is shown a power semiconductor module, which is a first embodiment according to the present invention. The module 2 includes switching elements or IGBTs 4u, 4v, 4w, 6u, 6v and 6w connected in parallel and series with each other, which constitute an inverter circuit 3. Specifically, the switching elements 4u, 4v and 4w are U-phase, V-phase and W-phase elements of the upper arm, respectively, and their collector terminals are connected with the cathode of a DC power supply or electrolytic capacitor 8. The switching elements 6u, 6v and 6w are U-phase, V-phase and W-phase elements of the lower arm, respectively, and their emitter terminals are connected with the anode of the DC power supply 8. The emitter terminal of the U-phase switching element 4u of the upper arm is connected with the collector terminal of the U-phase switching element 6u of the lower arm and with an external load or motor 10. The emitter terminal of the V-phase switching element 4v of the upper arm is connected with the collector terminal of the V-phase switching element 6v of the lower arm and with the motor 10. The emitter terminal of the W-phase switching element 4w of the upper arm is connected with the collector terminal of the W-phase switching element 6w of the lower arm and with the motor 10.

The inverter circuit 3 includes a drive circuit 11 for applying a voltage to the gate terminal of each of the switching elements 4u, 4v, 4w, 6u, 6v and 6w. The drive circuit 11 has diodes not shown each for driving the corresponding IGBT. The switching elements 4u, 4v, 4w, 6u, 6v and 6w and the drive circuit 11 may be incorporated in a chip or located in separate chips. The drive circuit 11 controls the switching elements on an on-off basis so that alternating current is applied to the motor 10. For instance, with the U-phase switching element 4u on, the V- and W-phase switching elements 4v and 4w off of the upper arm and with the V-phase switching element 4v on, the U- and W-phase switching elements 4u and 4w off of the lower arm, current passes through the U-phase switching element 4u of the upper arm, the motor 10 and then the V-phase switching element 6v of the lower arm, as indicated by a dotted line in the drawing.

The power semiconductor module 2 includes a detector 12 for detecting main circuit current, i.e. current passing through the switching elements and the motor 10. In the embodiment, the detector 12 as well as the inverter circuit 3 are accommodated in a case not-shown of the power semiconductor module 2.

Figure 2:
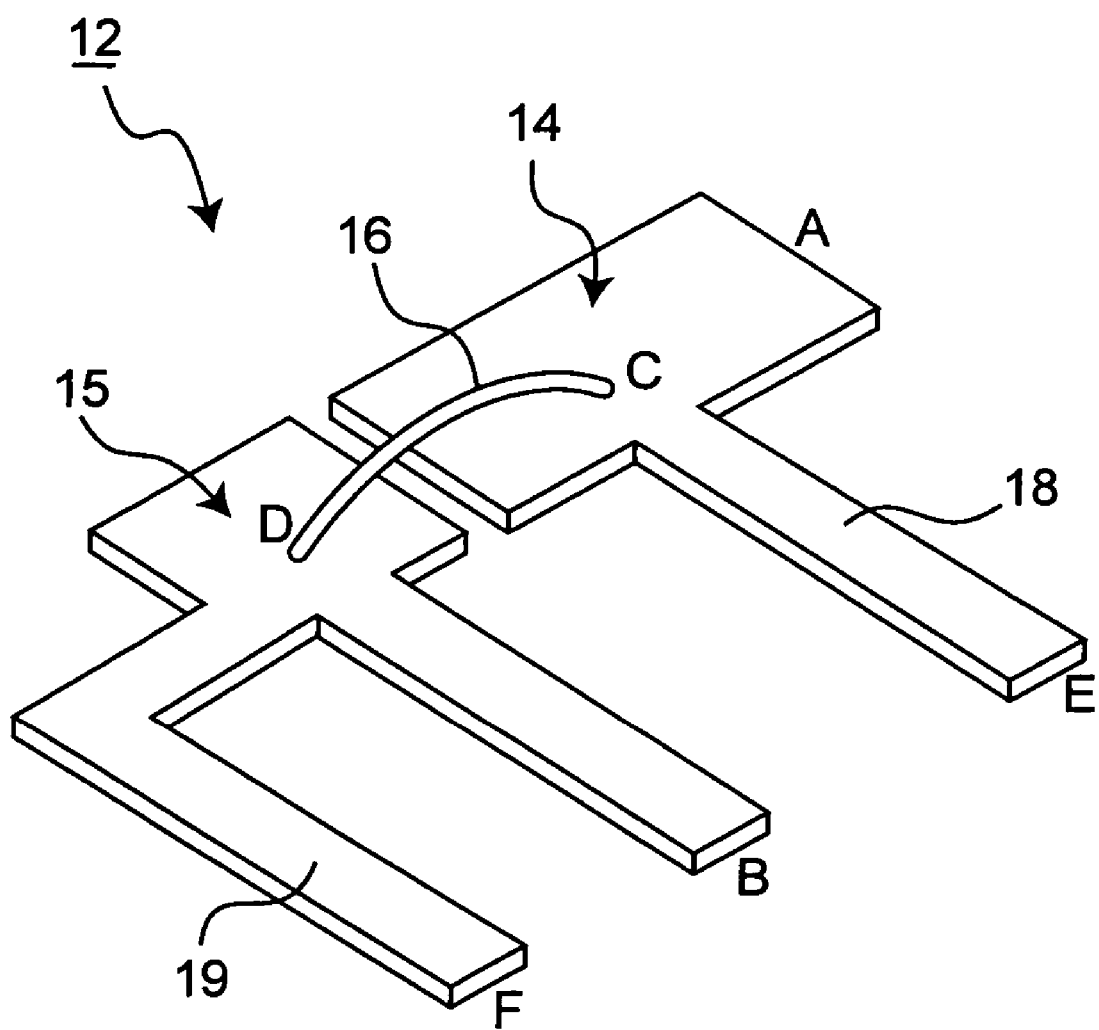
FIG. 2 is a schematic perspective view of the detector in FIG. 1.

With reference to FIG. 2, the detector 12 includes a pair of circuit patterns 14 and 15. The patterns 14 and 15 are connected with each other via a bonding wire 16. The bonding wire 16 is a thin wire made of metal such as aluminum. The circuit pattern 14 is connected with the emitter terminal (broadly, current output terminal) of each of the switching elements 6u, 6v and 6w of the lower arm and the current pattern 15 is with the anode of the power supply 8 so that main circuit current passes from the circuit pattern 14 to the circuit pattern 15 in an operation of the module 2. More specifically, main circuit current which passes from the emitter terminal of either one of the switching elements 6u, 6v and 6w of the lower arm of the inverter circuit 3 flows via an input port A of the circuit pattern 14 into the pattern 14, reaches a bonding point C of the bonding wire 16 on the pattern 14, and then passes through the bonding wire 16 to a bonding point D on the circuit pattern 15. The main circuit current then passes through the circuit pattern 15 to an output port B of the pattern 15 and flows into the power supply 8. In order to effectively diffuse heat which is generated in the bonding wire 16 due to current therethrough, the circuit patterns 14 and 15, which have a high heat conductivity, are preferably extended to a region under the bonding wire, as shown in FIG. 2.

A pair of terminal patterns 18 and 19 is extended from near the bonding points C and D of the pair of the circuit patterns 14 and 15, respectively. The terminal patterns 18 and 19 are connected at output ports E and F with a pair of voltage detection terminals not shown with high impedance. The voltage detection terminals are extended from the module case. Since the voltage detection terminals have high impedance, current does not substantially flow through the terminal pattern 18 (extending between the points C and E) and the terminal pattern 19 (extending between the points D and F). Accordingly, a potential difference between the pair of voltage detection terminals corresponds to a voltage drop between the bonding points C and D, i.e. a potential difference across the bonding wire 16. Also, since the potential difference between the pair of voltage detection terminals does not contain noise due to wiring inductance between the points A and C of the circuit pattern 14 and between the points D and B of the circuit pattern 15, it accurately indicates the potential difference across the bonding wire 16.

In the embodiment, the switching elements 4u, 4v, 4w, 6u, 6v and 6w are mounted on a lead frame and the circuit patterns 14 and 15 are formed as part of the lead frame. However, the circuit patterns 14 and 15 may be patterns made of, for example, copper formed on an insulating substrate.

Referring again to FIG. 1, connected with the voltage detection terminals extended from the module case is a circuit 20 for amplifying a very small voltage waveform detected by the terminals to facilitate sampling that follows. The voltage amplifying circuit 20 is connected with a circuit 22 including a table indicative of a relationship between the ohmic value and temperature of the bonding wire 16 for sampling a portion of the amplified voltage waveform and determining current which corresponds to the sampling value based on the temperature characteristic of the bonding wire 16. The temperature compensating circuit 22 is connected with a temperature sensor 23 for detecting a temperature of the bonding wire 16 during the operation. The temperature is measured at a portion of the case which forms an appearance of the module 2, preferably in the vicinity of the wire 16, assuming that the temperature of the case of the module 2 is substantially equal to that of the bonding wire 16. This assumption is confirmed by the inventors. The arrangement for measuring the temperature of the case is simpler than that for measuring the temperature of the bonding wire 16. The temperature compensating circuit 22 checks the table and calculates the value of main circuit current through the bonding wire 16 based on a voltage drop generated across the wire. The temperature compensating circuit 22 is connected with a control circuit 24 that transmits a control signal to the drive circuit 11 based on a detection signal indicative of the determined main circuit current from the circuit 22. The control circuit 24 may be, for example, a microcomputer or a DSP (Digital Signal Processor).

In the embodiment, a system according to the present invention for determining main circuit current includes at least the detector 12, the temperature sensor 23 and the temperature compensating circuit 22.

With the power semiconductor module 2 so constructed, the drive circuit 11 receives a control signal from the control circuit 24 so that it controls the switching elements 4u, 4v, 4w, 6u, 6v and 6w to actuate the motor 10. The detector 12 detects main circuit current passing through the switching elements and the motor 10. A potential difference across the bonding wire 16 is detected by means of the pair of the voltage detection terminals, so that the temperature compensating circuit 22 determines main circuit current through the motor 10. The control circuit 24 feed back controls the drive circuit 11 based on the main circuit current determined by the temperature compensating circuit 22.

To set one of the switching elements on, the drive circuit 11 applies a voltage to the gate terminal of the element so that a potential difference of the gate terminal relative to the output port of the detector 12 (output port of the circuit pattern 15), i.e. relative to the anode of the power supply 8 is generated in order to set a gate-emitter voltage (i.e. gate voltage) $V_{GE}$ to be equal to or more than a threshold. Conventionally, since a shunt resistance was used for detecting main circuit current, a voltage drop in the resistance caused the gate voltage to be reduced, so that the ON voltage (collector-emitter saturation voltage $V_{CE(sat)}$) is increased. This results in a loss of the switching element.

In contrast, in the embodiment, since the bonding wire 16 is used for detecting main circuit current, a voltage drop in the bonding wire 16 is small. As a result, the reduction of the gate voltage is suppressed and the loss of the switching element is reduced.

With regard to a power semiconductor module that includes, as power semiconductor element, a three-terminal element having a gate terminal or current control terminal (the module is not limited to an inverter device), an above-mentioned effect can also be achieved where the module includes a MOSFET (Metal Oxide. Semiconductor Field Effect Transistor) or a thyristor as power semiconductor element instead of IGBT and main circuit current through the power semiconductor element is detected by the detector 12 as shown in FIG. 2. For example, in case of a MOSFET, the current output terminal that is connected with the first circuit pattern 14 is a source terminal.

Since the system for determining main circuit current utilizes the dependency of the ohmic value of the bonding wire 16 on the temperature, main circuit current can be determined with high accuracy based on a voltage drop generated across the wire. Accordingly, the control circuit 24 can feed back control the drive circuit 11 with high accuracy.

Second Embodiment

Figure 3:
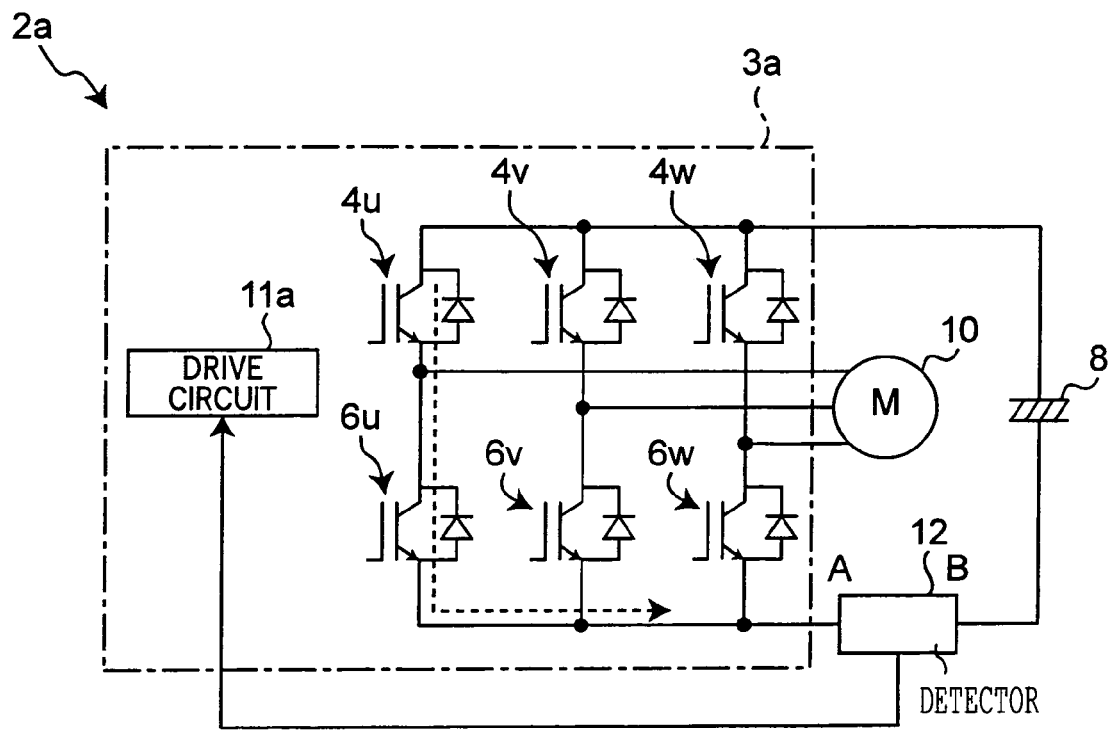
FIG. 3 is a circuit diagram showing a second embodiment of the power semiconductor module according to the present invention.

Referring to FIG. 3, a second embodiment of the present invention will be described hereinafter. In a description below, components identical or similar to those in the first embodiment are indicated by identical reference numbers or those with suffixes. The power semiconductor module 2a of the embodiment has a function to protect the switching elements where overcurrent is flown due to, for example, an excessive load to the motor 10 or short circuit. (i.e. current passes through the pair of switching elements connected in parallel with each other). Specifically, the drive circuit 11a of the inverter circuit 3a for actuating the switching elements 4u, 4v, 4w, 6u, 6v and 6w is connected with a pair of voltage detection terminals not shown, which is connected with the terminal patterns 18 and 19 (FIG. 2) of the detector 12, so that the drive circuit receives a signal indicative of a potential difference across the bonding wire 16 (FIG. 2). For instance, if current flows from the emitter terminal of the U-phase switching element 4u of the upper arm to the U-phase switching element 6u of the lower arm (i.e. short circuit), as indicated by a dotted line in FIG. 3 and therefore overcurrent passes through the bonding wire 16, a voltage drop generated across the wire is equal to or more than a reference value, causing the drive circuit 11a to deactivate the switching elements 4u, 4v, 4w, 6u, 6v and 6w.

In the embodiment, since the bonding wire 16, is used for detecting overcurrent, a wiring area is smaller compared with a construction in which a shunt resistance is used for detecting overcurrent, allowing a less costly and compact module to be provided.

Like in the first embodiment, since the boding wire 16 is used for detecting main circuit current, a voltage drop across the bonding wire 16 is small. As a result, the reduction of the gate voltage is suppressed and the loss of the switching element is reduced.

Third Embodiment

Figure 4:
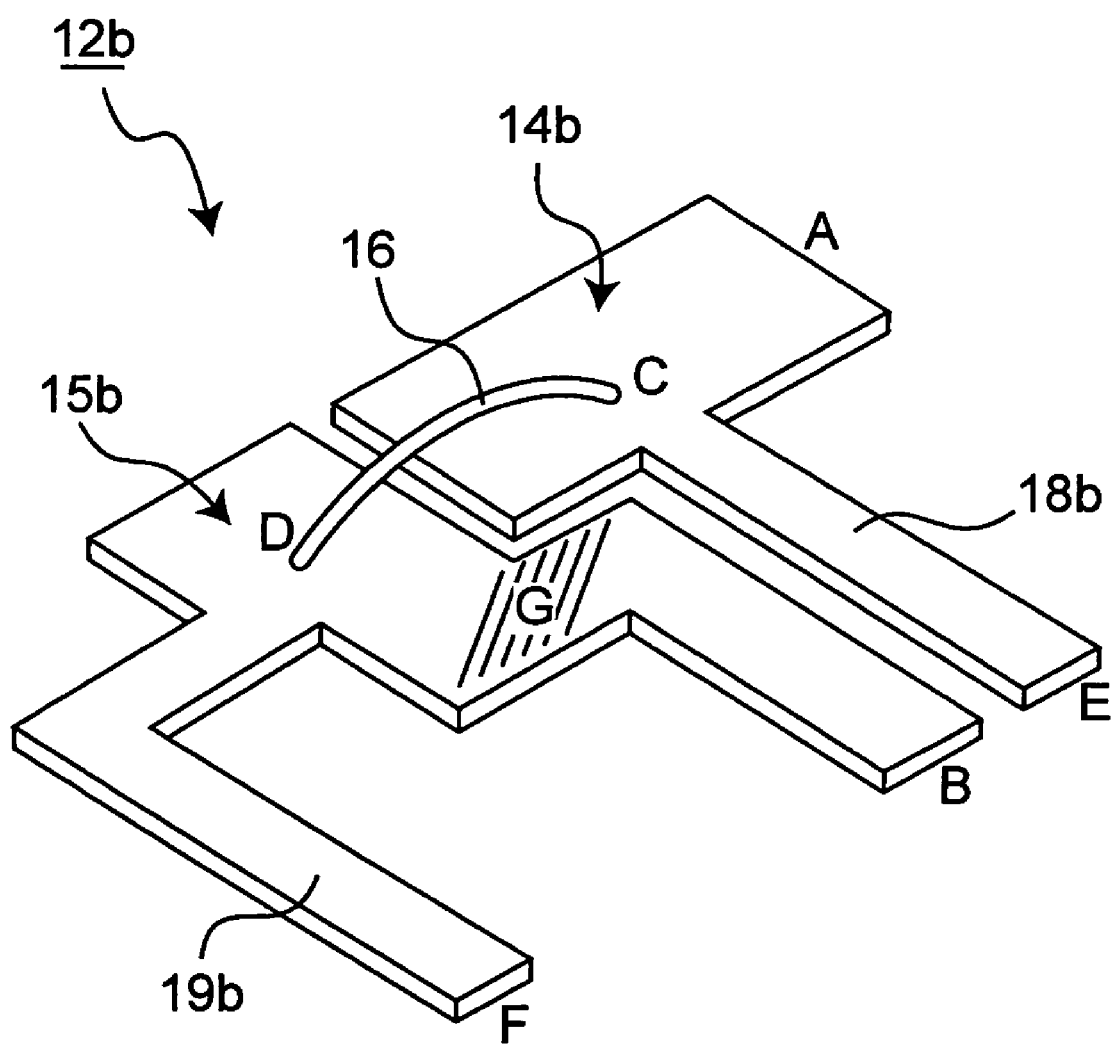
FIG. 4 is a schematic perspective view showing a detector of a third embodiment of the power semiconductor module according to the present invention.

Referring to FIG. 4, a third embodiment of the present invention will now be described. Each of the power semiconductor modules of the present embodiment and embodiments described later is similar to the module 2 shown in FIG. 1 except that circuit patterns of the detector for detecting a potential difference across the bonding wire are different from those in the first embodiment.

In the embodiment, like the detector 12 of the power semiconductor module 2, the detector 12b includes a pair of circuit patterns 14b and 15b connected via the bonding wire 16. A pair of terminal patterns 18b and 19b is extended from near bonding points C and D of the pair of the circuit patterns 14b and 15b, respectively. The pair of terminal patterns 18b and 19b is connected at output ports E and F with a pair of voltage detection terminals not shown with high impedance. In the embodiment, the circuit pattern 15b is formed so that a portion thereof (region G) is adjacent to and generally parallel to the bonding wire 16. Accordingly, in an operation of the module, the region G and the bonding wire 16 carry current in generally opposite directions. This restrains a generation of noise due to wiring inductance of the bonding wire 16 (and therefore can reduce noise absorption parts such as filter circuit), allowing a very small voltage drop generated across the bonding wire 16 to be detected. As such, according to the embodiment, a power semiconductor module can be provided in which main circuit current is detected without a shunt resistance and noise is reduced.

In the example shown, a region through which main circuit current passes in a direction generally opposed to the current direction through the bonding wire 16 is formed in the second circuit pattern 15b. However, the first circuit pattern 14b may be formed with such region instead, in order to reduce the wiring inductance of the bonding wire 16.

Fourth Embodiment

Figure 5:
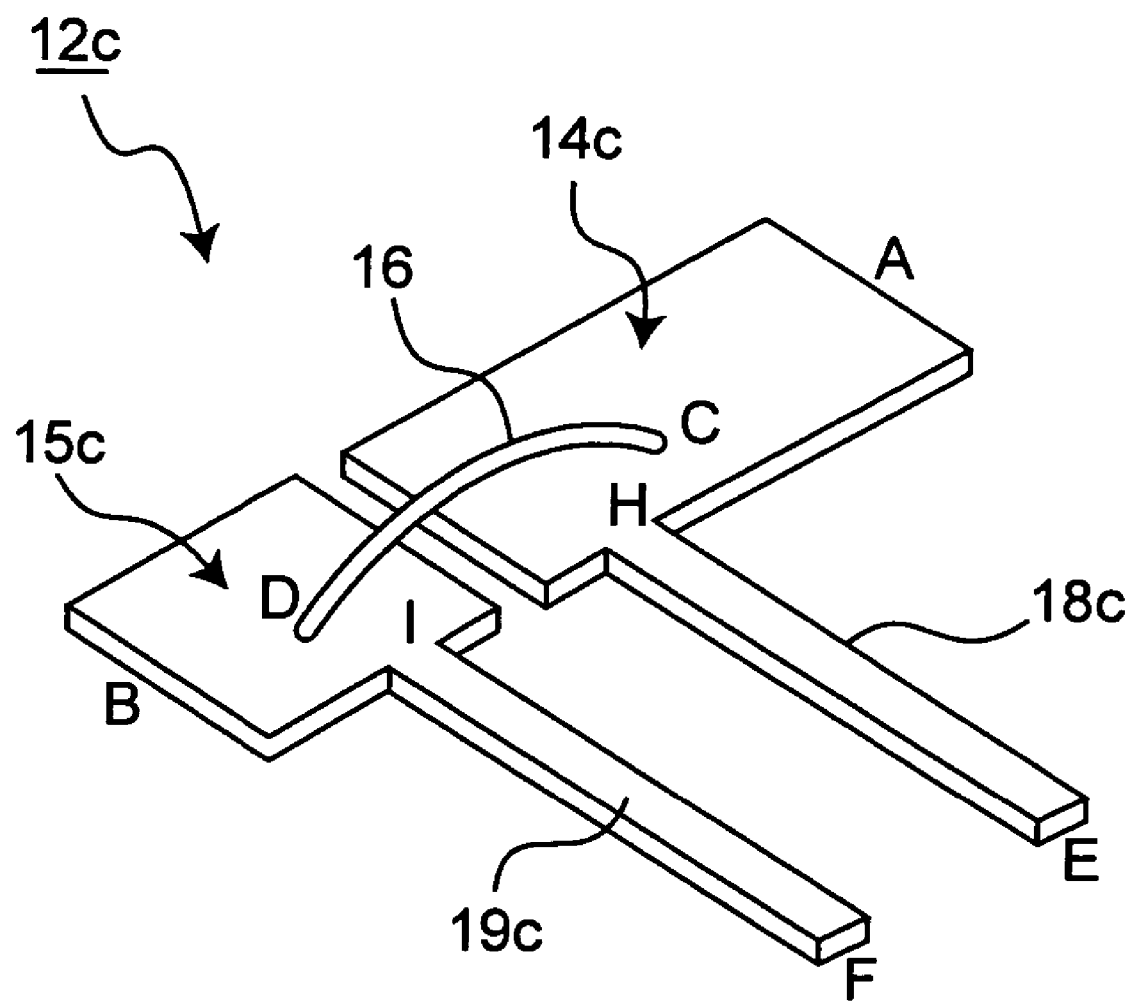
FIG. 5 is a schematic perspective view showing a detector of a fourth embodiment of the power semiconductor module according to the present invention.

Referring to FIG. 5, a fourth embodiment of the power semiconductor module according to the present invention will now be described. In the embodiment, like the detector 12 of the power semiconductor module 2, the detector 12c includes a pair of circuit patterns 14c and 15c connected with each other via the bonding wire 16. A pair of terminal patterns 18c and 19c is extended from points H and I that are located internally to bonding points C and D of the pair of circuit patterns 14c and 15c with regard to an extension direction of the bonding wire 16. The pair of terminal patterns 18c and 19c is connected at output ports E and F with a pair of voltage detection terminals not shown with high impedance. Therefore, current does not substantially flow between the points. C and H and between the points D and I as well as between the points H and E and between the points I and F.

In the embodiment, since the staring points H and I of the terminal patterns 18c and 19c are located "internally" to the bonding points C and D, a noise effect due to the inductance of wiring other than the bonding wire 16 is eliminated, allowing a very small voltage drop generated across the bonding wire 16 to be detected.

Although the terminal patterns 18c and 19c are extended from the same side of the circuit patterns 14c and 15c, respectively, they may be extended from opposite sides.

Also, the present embodiment may be combined with the above-mentioned embodiments or embodiments described below.

Fifth Embodiment

Figure 6:
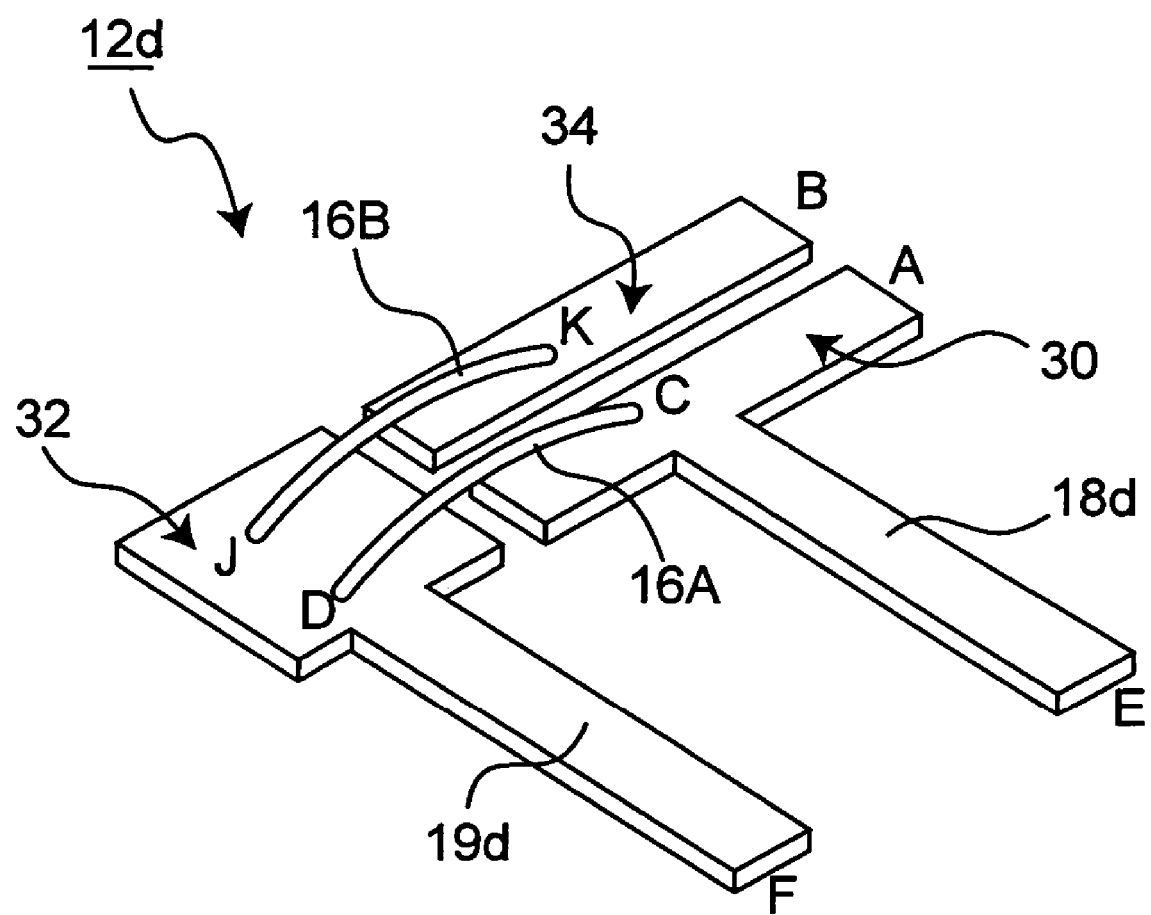
FIG. 6 is a schematic perspective view showing a detector of a fifth embodiment of the power semiconductor module according to the present invention.

Referring to FIG. 6, a fifth embodiment of the power semiconductor module according to the present invention will now be described. In the embodiment, the detector 12d includes three circuit patterns 30, 32 and 34. The circuit patterns 30 and 34 are extended adjacent to and generally parallel to each other. The circuit pattern 32 is opposed to one ends of the circuit patterns 30 and 34 with regard to their extension direction. The circuit patterns 30 and 32 are connected with each other via a bonding wire 16A. A pair of terminal patterns 18d and 19d is extended from near bonding points C and D of the circuit patterns 30 and 32, respectively. The terminal patterns 18d and 19d are connected at output ports E and F with a pair of voltage detection terminals not shown with high impedance.

The circuit patterns 32 and 34 are connected with each other via a bonding wire 16B that is adjacent to and generally parallel to the bonding wire 16A. In an operation of the module, main circuit current passes through the circuit patterns 30, 32 and then 34. More specifically, main circuit current which passes from the inverter circuit 3. (See FIG. 1) flows via an input port A of the rectangular circuit pattern 30 into the pattern 30, reaches the bonding point C of the bonding wire 16A on the pattern 30, and then passes through the bonding wire 16A to the bonding point D on the circuit pattern 32. The main circuit current then passes through the circuit pattern 32 and reaches a bonding point J of the bonding wire 16B on the pattern 32. Next, the main circuit current passes-through the bonding wire 16B to a bonding point K on the circuit pattern 34 and then passes through the circuit pattern 34 to an output port B and flows into the power supply 8 (See FIG. 1).

In the embodiment, in an operation of the module, the bonding wires 16A and 16B carry current in generally opposite directions. This restrains a generation of noise due to wiring inductance of the bonding wires 16A and 16B, allowing a very small voltage drop generated across the bonding wire 16A to be detected. As such, according to the embodiment, a power semiconductor module can be provided in which main circuit current is detected without a shunt resistance and noise is reduced.

Note that, in the example shown, the region between the points A and C and the region between the points K and B carry current in generally opposite directions, thereby reducing the wiring inductance of the module.

Sixth Embodiment

Figure 7:
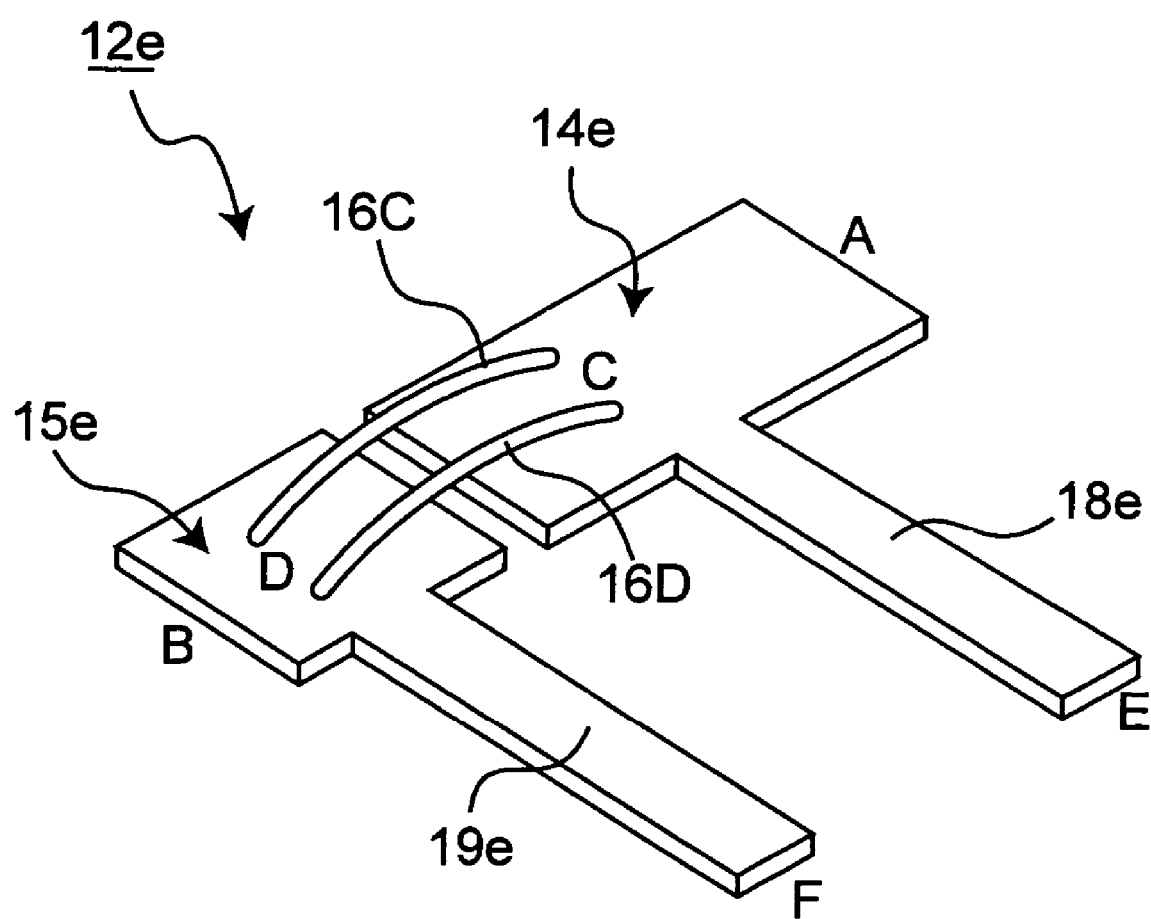
FIG. 7 is a schematic perspective view showing a detector of a sixth embodiment of the power semiconductor module according to the present invention.

Referring to FIG. 7, a sixth embodiment of the power semiconductor module according to the present invention will now be described. In the embodiment, the detector 12e includes a plurality of (two in the example shown) bonding wires 16C and 16D through which the circuit patterns 14e and 15e are connected with each other. A pair of terminal patterns 18e and 19e is extended from near bonding points C and D of the pair of circuit patterns 14e and 15e, respectively. Where the combined resistance of the bonding wires 16C and 16D is set equal to that of a single bonding wire as in the previous embodiments, since the surface area of each of the bonding wires is increased, the radiation characteristic of the bonding wire can be improved. As a result, the temperature increase of the bonding wire during the operation can be suppressed.

An appropriate selection of the number of the bonding wires, diameter and/or length of the bonding wire allows an ohmic value of the voltage detection resistance to be set to a desired value. This is practically very useful in comparison with a construction in which a shunt resistance is used.

Note that in the previous embodiments a plurality of bonding wires may be used for connecting a pair of circuit patterns.

What is claimed is:

1. A power semiconductor module with a detector for detecting main circuit current passing through a power semiconductor element, the detector comprising:

first, second and third circuit patterns;

a first bonding wire connected at first and second bonding points with the first and second circuit patterns, respectively;

a second bonding wire connected at third and fourth bonding points with the second and third circuit patterns, respectively; and a pair of terminal patterns extended from near the first and second bonding points of the first and second circuit patterns or from near the third and fourth bonding points of the second and third circuit patterns, wherein the detector is designed to detect a potential difference between the pair of terminal patterns generated by flowing main circuit current through the first circuit pattern, the first bonding wire, the second circuit pattern, the second bonding wire and then the third circuit pattern, in order to detect a potential difference across the first bonding wire or second bonding wire; and wherein the first and second bonding wires are extended adjacent to and generally parallel to each other so that the first and second bonding wires carry current in generally opposite directions.

2. A system for determining a main circuit current passing through a power semiconductor element of a power semiconductor module, comprising:

a detector including, first and second circuit patterns, a bonding wire connected at first and second bonding points with the first and second circuit patterns, respectively, and a pair of terminal patterns extended from near the first and second bonding points of the first and second circuit patterns, the detector being designed to detect a potential difference between the pair of terminal patterns generated by flowing the main circuit current through the first circuit pattern, the bonding wire and then the second circuit pattern, in order to detect a potential difference across the bonding wire;

a temperature sensor for detecting a temperature of the bonding wire; and a temperature compensating circuit having a table indicative of a relationship between the temperature and an ohmic value of the bonding wire for determining an ohmic value of the bonding wire based on the temperature information from the temperature sensor and determining the main circuit current based on the ohmic value and the potential difference detected by the detector.

3. The system in accordance with claim 2, wherein the temperature sensor detects a temperature of a portion of a case of the power semiconductor module.

* * * * *